(12) United States Patent
Choi et al.

(10) Patent No.: US 9,227,361 B2
(45) Date of Patent: Jan. 5, 2016

(54) IMPRINT LITHOGRAPHY TEMPLATE

(71) Applicant: Molecular Imprints, Inc., Austin, TX (US)

(72) Inventors: Byung-Jin Choi, Austin, TX (US); Yeong-Jun Choi, Cedar Park, TX (US); Kosta S. Selinidis, Austin, TX (US); Steven C. Shackleton, Austin, TX (US)

(73) Assignee: Canon Nanotechnologies, Inc., Austin, TX (US)

( * ) Notice: Subject to any disclaimer, the term of this patent is extended or adjusted under 35 U.S.C. 154(b) by 0 days.

(21) Appl. No.: 14/026,775

(22) Filed: Sep. 13, 2013

(65) Prior Publication Data

US 2014/0008841 A1  Jan. 9, 2014

Related U.S. Application Data

(62) Division of application No. 12/964,081, filed on Dec. 9, 2010, now abandoned.

(51) Int. Cl.
  *B29C 59/00* (2006.01)
  *B82Y 10/00* (2011.01)
  *B82Y 40/00* (2011.01)
  *G03F 7/00* (2006.01)

(52) U.S. Cl.
  CPC ............... *B29C 59/002* (2013.01); *B82Y 10/00* (2013.01); *B82Y 40/00* (2013.01); *G03F 7/0002* (2013.01)

(58) Field of Classification Search
  CPC ...... B29C 59/002; B82Y 10/00; B82Y 40/00; G03F 7/0002
  USPC .................................................. 264/293, 319
  See application file for complete search history.

(56) References Cited

U.S. PATENT DOCUMENTS

| | | |
|---|---|---|
| 6,873,087 B1 | 3/2005 | Choi et al. |
| 6,932,934 B2 | 8/2005 | Choi et al. |
| 6,936,194 B2 | 8/2005 | Watts |
| 7,077,992 B2 | 7/2006 | Sreenivasan et al. |
| 7,090,716 B2 | 8/2006 | McMackin et al. |
| 7,157,036 B2 | 1/2007 | Choi et al. |
| 7,179,396 B2 | 2/2007 | Sreenivasan |
| 7,396,475 B2 | 7/2008 | Sreenivasan |
| 7,462,028 B2 | 12/2008 | Cherala et al. |
| 8,076,386 B2 | 12/2011 | Xu et al. |
| 8,349,241 B2 | 1/2013 | Sreenivasan et al. |
| 2004/0065252 A1 | 4/2004 | Sreenivasan et al. |
| 2006/0231979 A1 | 10/2006 | Van Santen et al. |
| 2009/0267267 A1 | 10/2009 | Yoneda et al. |

FOREIGN PATENT DOCUMENTS

| | | |
|---|---|---|
| WO | 2007/067469 | 6/2007 |
| WO | 2007/123805 | 11/2007 |

*Primary Examiner* — Alison Hindenlang
*Assistant Examiner* — Robert J Grun
(74) *Attorney, Agent, or Firm* — Cameron A. King

(57) ABSTRACT

Nano imprint lithography templates for purging of fluid during nano imprint lithography processes are described. The templates may include an inner channel and an outer channel. The inner channel constructed to provide fluid communication with a process gas supply to a region between the template and a substrate during the nano imprint lithography process. The outer channel constructed to evacuate fluid and/or confine fluid between the active area of template and the substrate.

16 Claims, 4 Drawing Sheets

IMPRINT LITHOGRAPHY TEMPLATE

CROSS REFERENCE TO RELATED APPLICATIONS

The present application is a divisional of U.S. Ser. No. 12/964,081 filed Dec. 9, 2010; which itself claims priority to U.S. Ser. No. 61/285,367, filed Dec. 10, 2009; both of which are hereby incorporated by reference in their entireties.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields, while increasing the circuits per unit area formed on a substrate; therefore, nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Pat. No. 8,349,241, U.S. Patent Publication no. 2004/0065252, and U.S. Pat. No. 6,936,194, all of which are hereby incorporated by reference.

An imprint lithography technique disclosed in each of the aforementioned U.S. patent publication and patents includes formation of a relief pattern in a polymerizable layer and transferring a pattern corresponding to the relief pattern into an underlying substrate. The substrate may be coupled to a motion stage to obtain a desired positioning to facilitate the patterning process. Additionally, the substrate may be coupled to a substrate chuck. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
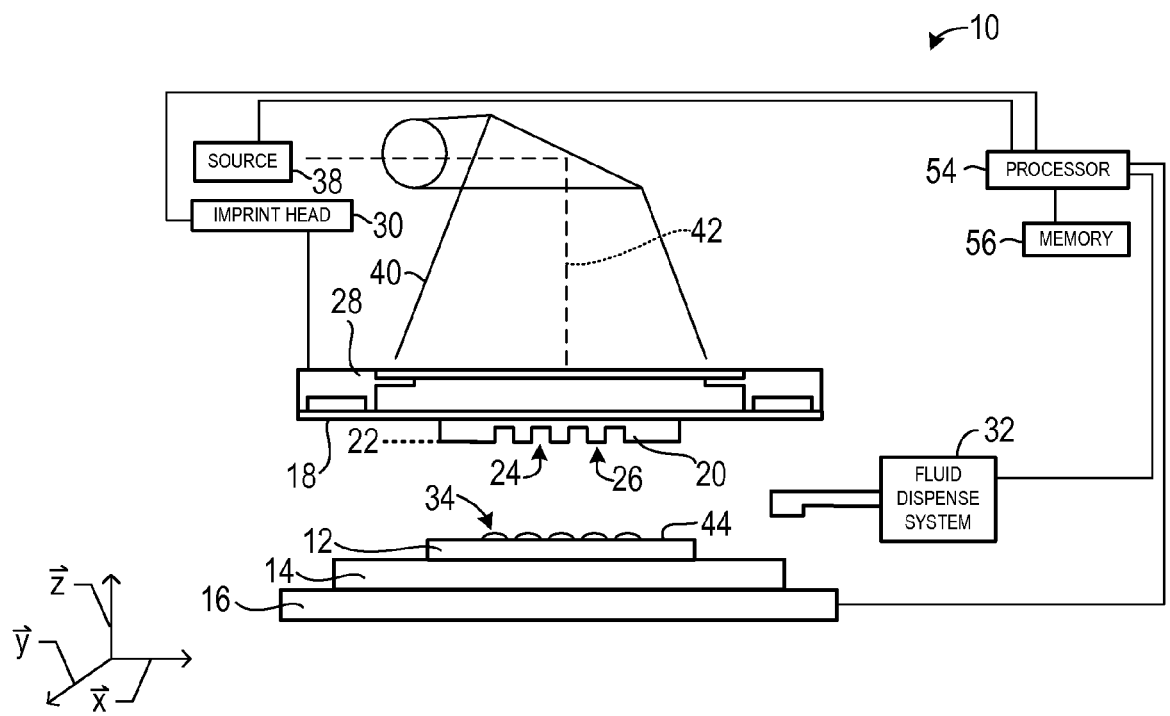
FIG. 1 illustrates a simplified side view of a lithographic system.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nanoparticles having use within the bio-domain, solar cell industry, battery industry, and/or other industries requiring a functional nano-particle. For example, formable material 34 may comprise a monomer mixture as described in U.S. Pat. Nos. 7,157,036 and 8,076,386, both of which are herein incorporated by reference. Alternatively, formable material 34 may include, but is not limited to, biomaterials (e.g., PEG), solar cell materials (e.g., N-type, P-type materials), and/or the like.

Figure 2:
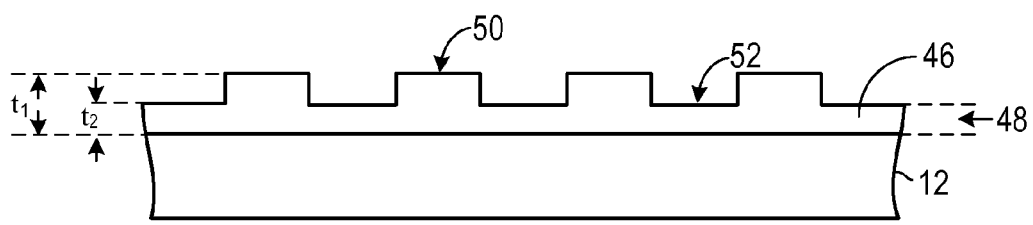
FIG. 2 illustrates a simplified side view of the substrate illustrated in FIG. 1, having a patterned layer thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. Nos. 6,932,934, 7,077,992, 7,179,396, and 7,396,475, all of which are hereby incorporated by reference in their entirety.

During the above-mentioned process, gas purging (e.g., $CO_2$ purging, He purging, and/or the like) may be used to replace large molecular components at the interface of template 18 and substrate 12. Such large molecular components may generally result in void defects to patterned layer 46 formed on substrate 12 during the nano-imprint lithography process. One such purging scheme, using a chuck body design, is detailed in U.S. Pat. No. 7,090,716, which is hereby incorporated by reference in its entirety.

Gas purging may be dependent upon purging time, overall amount of the purging gas, and/or confinement of the purging gas within a controlled space so as to limit interaction with neighboring components of system 10. As an efficient purging apparatus, template 18 may possess multiple channels to distribute purging gas into the interface between template 18 and substrate 12. Templates having multiple channels were described in U.S. Pat. No. 7,462,028 for gas evacuation, which is hereby incorporated by reference in its entirety. Modifications of the templates described therein may provide schemes for purging and/or gas confinement.

Figure 3A:
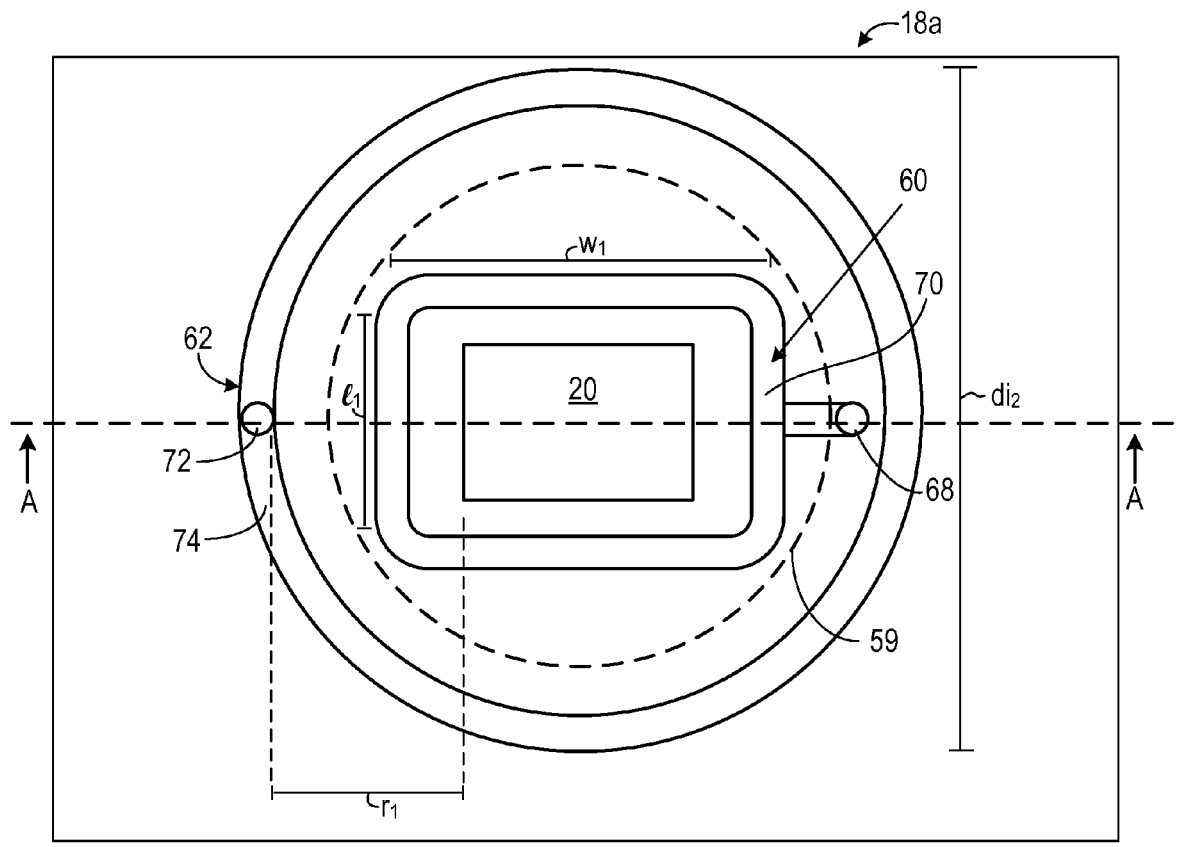
FIGS. 3A and 3B illustrate a top down view and a simplified side view of one embodiment of an exemplary template for use in the system of FIG. 1.

Described herein are nano imprint lithography templates having elements for purging and/or gas confinement. Templates may include channels for distribution and evacuation/confinement of the purged gas. Alternatively, or in addition to channels, templates may include one or more holes for distribution and evacuation and/or confinement of gas. FIGS. 3 and 4 illustrate an exemplary templates 18a and 18b providing distribution of fluid (e.g., purging gas) at the interface of the template and substrate 12 when used in system 10 of FIG. 1. For simplicity, template 18a illustrates the use of channels 60 and 62 and template 18b illustrates the use of holes 64; however, it should be noted that either template 18a or template 18b may be modified to include channels 60 and 62 or holes 64 for distribution and/or evacuation/confinement of gas.

Design of channels 60 and 62 and/or holes 64 may provide control of atmosphere between templates 18a or 18b and substrate 12 during imprinting. For example, channels 60 and 62 and/or holes 64 may facilitate passage and evacuation of fluids (e.g. $CO_2$, He, and the like). In one embodiment, channels 60 and 62 and/or holes 64 may provide a substantially uniform partial vacuum substantially between an active area 66 of template 18 and substrate 12.

Template 18a may include a body 61. Body 61 may include a first surface 63 and a second surface 65. Template 18a may include a recessed portion 59. Recessed portion 59 may be positioned on first surface 63 of body 61.

Figure 3B:
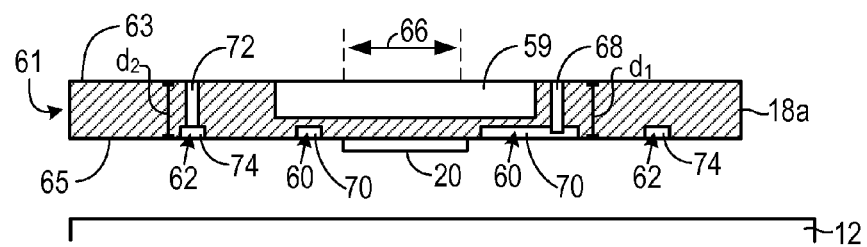

Body 61 may also include an active area 66. Active area 66 may include a region having mold 20 and/or other patterning regions of template 18a positioned in superimposition with polymerizable material 34 during patterning as described in relation to FIGS. 1 and 2. For example, active area 66 may include mold 20 positioned on second surface 65 of body 61 as illustrated in FIG. 3B.

Channel 60 may be an inner channel positioned adjacent to active area 66. Channel 60 may be a recessed portion in second surface of template 18a For example, channel 60 may surround active area 66 of template 18a. Channel 60 may have a depth $d_1$, length $l_1$, and width $w_1$. For example, in one embodiment, depth $d_1$ may be approximately 10-200 μm, length $l_1$ may be approximately 5-50 mm, and width $w_1$ may be approximately 5-50 mm.

Channel 60 may be circular, cylindrical, or any fanciful shape. For example, in FIG. 3A, channel 60 is rectangular. In one embodiment, dimensions of length $l_1$ and width $w_1$ may be constructed to be greater than dimensions of a field being imprinted on substrate 12. Imprinting of a field is further described and illustrated in relation to FIGS. 1 and 2.

Channel 60 may include a port 68 and an aperture 70. Port 68 may provide channel 60 in fluid communication with a process gas supply (not shown). Process gas supplies are known within the industry. Port 68 may extend from channel through the body 61 of template 18a to first surface 63. Aperture 70 may forms a recessed portion in second surface 65 of body 61. Aperture 70 provides channel 60 in fluid communication with atmosphere between template 18 and substrate 12.

Channel 62 may be an outer channel positioned at a distance from active area 64. Channel 62 may be positioned at a distance $r_1$ (e.g., approximately 1-40 mm) from active area 64. Distance $r_1$ between active area 64 and channel 62 may be determined to provide confinement of fluid within active area 64 of template 18 during imprinting. For example, distance $r_1$ may be determined such that channel 62 may evacuate and simultaneously confine purged gas to remain substantially between active area 66 and substrate 12. In one embodiment, confinement of purged gas may include the area between template 18a and substrate 12 substantially within the circumference of channel 62.

Channel 62 may have a depth $d_2$ and diameter $di_2$. Depth $d_2$ may be substantially similar to depth $d_1$ of channel 60. Alternatively, depth $d_2$ may be different than depth $d_1$ of channel 60. Diameter $di_2$ of channel 62 may be approximately 40-100 mm. Although illustrated as circular, channel 62 may be any fanciful shape including, but not limited to, triangular, rectangular, and the like. Channel 62 may include port 72 and aperture 74. Port 72 may extend from first surface 63 to second surface 63 of body 61 and may provide channel 62 in fluid communication with a waste container and/or atmosphere outside of system 10. Aperture 74 may provide a recessed region in second surface 65 of body 61 and may provide channel 62 in fluid communication with atmosphere between template 18 and substrate 12.

Figure 5:
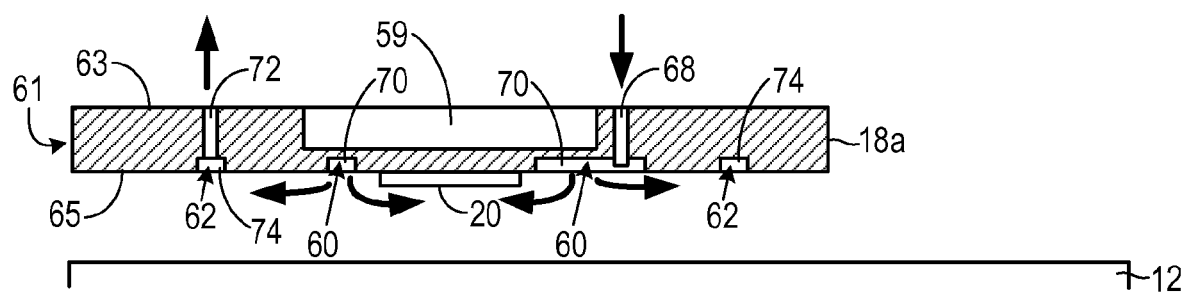
FIG. 5 illustrates a simplified side view of the template of FIG. 3B having fluid flowing therethrough.

FIG. 5 illustrates FIG. 3B having fluid supplied therethrough. Fluid may enter port 68 of channel 60 and be directed through aperture 70 of channel 60 to atmosphere between active area 66 of template 18 and substrate 12. Fluid may be confined between active area 66 of template 18 and substrate 12 by channel 62. For example, fluid may be directed towards channel 62 and evacuated through aperture 74 towards port 76 at which point fluid may be provided in a waste container and/or provided to atmosphere outside of system 10.

Figure 4A:
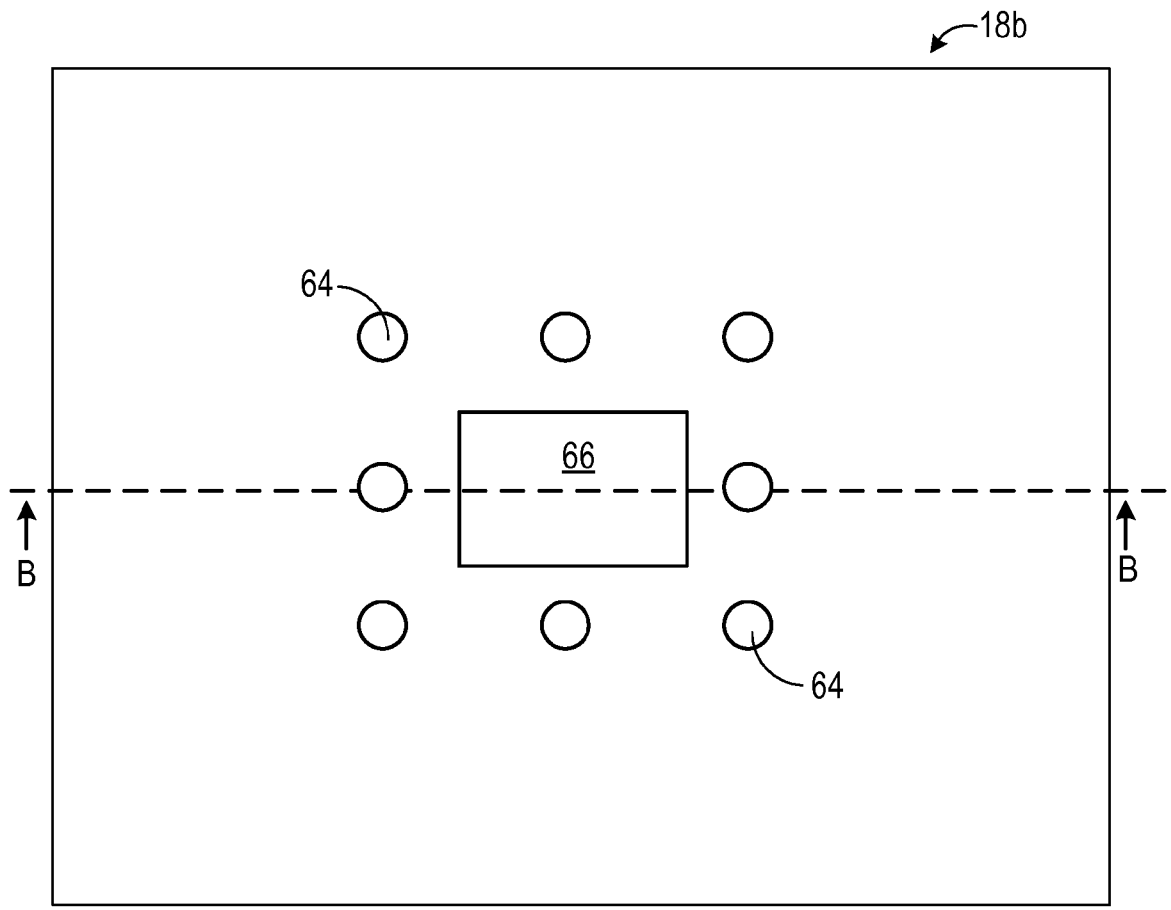
FIGS. 4A and 4B illustrate a top down view and a simplified side view of another embodiment of an exemplary template for use in the system of FIG. 2.
Figure 4B:
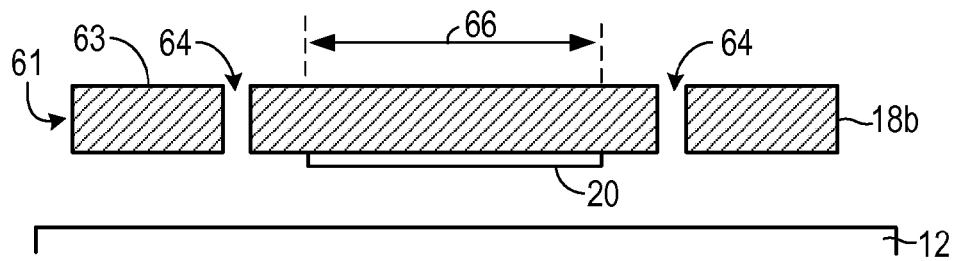

FIGS. 4A and 4B illustrate holes 64 within template 18b. Fluid may be pulsed and/or evacuated through one or more holes 64. For example, the embodiment illustrated in FIG. 3B may further include one or more holes 64 such that fluid may be pulsed through holes 64 and then evacuated through channel 62.

Holes 64 may be positioned adjacent active area 66 and extend through body 61 of template 18a from first surface 63 to second surface 65. Fluid may be provided through channel 60 and pulsed through holes 64. Remaining fluid may then be evacuated through channel 62. Pulsing of fluid may draw fluid across active area 66.

In another embodiment, at least one of holes 64 and/or channels 60 and 62 may be used to sequentially distribute and evacuate fluid. For example, channel 60 and/or a first portion of holes 64 may distribute fluid to region between active area 66 of template 18 and substrate 12 at which point a second portion of holes 64 and/or channel 62 may evacuate fluid from between active area 66 of template 18 and substrate 12.

What is claimed is:

1. A method, comprising:
   providing fluid in an inner channel of an imprint lithography template, the inner channel positioned adjacent to an active area of the template, the inner channel having an aperture and a port, the port constructed to provide the inner channel in fluid communication with a process gas supply and the aperture constructed to provide the inner channel in fluid communication with atmosphere adjacent to the second surface of the body; and,
   confining the fluid between the active area of the template and a substrate positioned in superimposition with the template, wherein confining includes evacuating fluid through an outer channel, the outer channel positioned at a distance from the active area of the template, wherein the distance between the active area and the outer channel is constructed such that the outer channel evacuates fluid and simultaneously confines fluid within a circumference of the outer channel during an imprint lithography process.

2. The method of claim 1, further comprising, directing fluid through an outer channel of the template to a waste container.

3. The method of claim 1, further comprising, directing fluid through an outer channel of the template to atmospheric conditions.

4. The method of claim 1, further comprising pulsing fluid through at least one hole positioned adjacent to the active area of the template.

5. The method of claim 1, further comprising sequentially pulsing fluid through a first portion of holes and a second portion of holes positioned adjacent to the active area of the template.

6. The method of claim 1, wherein providing fluid in an inner channel of an imprint lithography template further includes sequentially pulsing fluid through the inner channel and a first portion of holes positioned adjacent to the active area of the template.

7. The method of claim 6, further comprising evacuating fluid through a second portion of holes positioned adjacent to the active area of the template.

8. The method of claim 1, further comprising evacuating fluid through holes positioned adjacent to the active area of the template.

9. An imprint lithography method comprising:
   providing an imprint lithography template, the imprint lithography template having
       a body having a first surface and a second surface;
       an active area positioned on the second surface of the body;
       an inner channel positioned adjacent to the active area, the inner channel having an inner aperture and an inner port, the inner aperture forming an inner recessed region in the second surface of the body and the inner port extending from the aperture to the first surface of the body;
       an outer channel positioned at a distance from the active area, the outer channel having an outer aperture and outer port, the aperture forming an outer recessed region in the second surface of the body surrounding the inner recessed region, and the outer port extending from the aperture to the first surface of the body;
   positioning the imprint lithography template in superimposition with a substrate;
   providing fluid through the inner channel to the active area of the template;
   confining the fluid between the active area and the substrate, wherein the fluid is confined within a circumference of the outer channel; and,
   evacuating the fluid through the outer channel while simultaneously confining fluid within a circumference of the outer channel.

10. The imprint lithography method of claim 9, further comprising providing a process gas supply in fluid communication with the inner port of the inner channel for providing the fluid to the inner channel.

11. The imprint lithography method of claim 9, further comprising providing a waste container in fluid communication with the outer port.

12. The imprint lithography method of claim 9, wherein the outer port is in fluid communication with an external atmosphere.

13. An imprint lithography method comprising:
   providing an imprint lithography template, the imprint lithography template having
       a body having a first surface and a second surface;
       an active area positioned on the second surface of the body;
       a plurality of holes distributed around and surrounding the active area, each hole extending from the second surface of the body to the first surface of the body;
   positioning the imprint lithography template in superimposition with a substrate;
   providing fluid through the at least one of the plurality of holes to the active area of the template; and,
   confining the fluid between the active area and the substrate.

14. The method of claim 13 further comprising pulsing fluid through at least one of the plurality of holes.

15. The imprint lithography method of claim 13, further comprising evacuating the fluid through at least one of the plurality of holes.

16. The method of claim 13 further comprising sequentially pulsing the fluid through at least one of the plurality of holes and evacuating the fluid through at least one of the plurality of holes.

* * * * *